United States Patent
Seo et al.

(10) Patent No.: US 8,294,171 B2
(45) Date of Patent: Oct. 23, 2012

(54) LIGHT EMITTING DEVICE HAVING PLURALITY OF NON-POLAR LIGHT EMITTING CELLS AND METHOD OF FABRICATING THE SAME

(75) Inventors: Won Cheol Seo, Ansan-si (KR); Kwang Choong Kim, Ansan-si (KR); Kyung Hee Ye, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/345,348

(22) Filed: Jan. 6, 2012

(65) Prior Publication Data

US 2012/0104424 A1    May 3, 2012

Related U.S. Application Data

(62) Division of application No. 12/624,011, filed on Nov. 23, 2009, now Pat. No. 8,183,072.

(30) Foreign Application Priority Data

Dec. 31, 2008  (KR) .................. 10-2008-0138422

(51) Int. Cl.
*H01L 33/00* (2010.01)
(52) U.S. Cl. ................ 257/98; 257/96; 257/97; 438/34; 438/42
(58) Field of Classification Search .............. 257/96–98; 438/34, 42
See application file for complete search history.

(56) References Cited

U.S. PATENT DOCUMENTS

| | | | |
|---|---|---|---|
| 7,095,061 B2 | 8/2006 | Steigerwald et al. | |
| 7,417,259 B2 | 8/2008 | Sakai et al. | |
| 7,709,849 B1 | 5/2010 | Kal et al. | |
| 7,723,736 B2 | 5/2010 | Lee et al. | |
| 7,838,891 B2 | 11/2010 | Lee et al. | |
| 7,846,755 B2 | 12/2010 | Kal et al. | |
| 7,880,181 B2 | 2/2011 | Yoon et al. | |
| 2008/0087902 A1 | 4/2008 | Lee et al. | |
| 2009/0039359 A1 | 2/2009 | Yoon et al. | |
| 2009/0085048 A1 | 4/2009 | Lee et al. | |

(Continued)

FOREIGN PATENT DOCUMENTS

JP    2004-006582    1/2004

(Continued)

OTHER PUBLICATIONS

Non-Final Office Action of U.S. Appl. No. 12/623,990 dated on Jan. 19, 2012.

(Continued)

*Primary Examiner* — Telly Green
(74) *Attorney, Agent, or Firm* — H.C. Park & Associates, PLC (57) ABSTRACT

Disclosed are a light emitting device having a plurality of non-polar light emitting cells and a method of fabricating the same. This method comprises preparing a first substrate of sapphire or silicon carbide having an upper surface with an r-plane, an a-plane or an m-plane. The first substrate has stripe-shaped anti-growth patterns on the upper surface thereof, and recess regions having sidewalls of a c-plane between the anti-growth patterns. Nitride semiconductor layers are grown on the substrate having the recess regions, and the nitride semiconductor layers are patterned to form the light emitting cells separated from one another. Accordingly, there is provided a light emitting device having non-polar light emitting cells with excellent crystal quality.

20 Claims, 7 Drawing Sheets

U.S. PATENT DOCUMENTS

| | | |
|---|---|---|
| 2009/0267085 A1 | 10/2009 | Lee et al. |
| 2009/0283787 A1 | 11/2009 | Donofrio et al. |
| 2010/0078656 A1 | 4/2010 | Seo et al. |
| 2010/0117111 A1 | 5/2010 | Illek et al. |
| 2010/0148190 A1 | 6/2010 | Kim et al. |
| 2010/0163887 A1 | 7/2010 | Kim et al. |
| 2010/0244060 A1 | 9/2010 | Lee et al. |
| 2011/0140135 A1 | 6/2011 | Lee et al. |
| 2011/0169040 A1 | 7/2011 | Seo et al. |
| 2011/0175129 A1 | 7/2011 | Lee et al. |

FOREIGN PATENT DOCUMENTS

| | | |
|---|---|---|
| JP | 2008-130656 | 6/2008 |
| JP | 2008-141015 | 6/2008 |
| KR | 10-0599012 | 7/2006 |
| KR | 10-0838197 | 6/2008 |
| KR | 10-2010-0016631 | 2/2010 |
| KR | 10-2010-0036617 | 4/2010 |
| KR | 10-2010-0079843 | 7/2010 |
| WO | 2004/023568 | 3/2004 |
| WO | 2007/001124 | 1/2007 |

OTHER PUBLICATIONS

Notice of Allowance of U.S. Appl. No. 12/624,011 dated on Jan. 24, 2012.

Non-Final Office Action dated Aug. 5, 2010 for U.S. Appl. No. 12/123,162.

Notice of Allowance dated Nov. 30, 2010 for U.S. Appl. No. 12/123,162.

The specification, claims, abstract and drawings of U.S. Appl. No. 13/194,317, filed Jul. 29, 2011.

Notice of Allowance of related U.S. Appl. No. 12/623,968 dated May 21, 2012.

Non-Final Office Action of U.S. Appl. No. 12/623,968 dated on Jan. 17, 2012.

Notice of Allowance of U.S. Appl. No. 12/623,990 dated Apr. 27, 2012.

International Search Report of PCT/KR2011/006544 dated May 1, 2012.

Written Opinion of PCT/KR2011/006544 dated May 1, 2012.

LIGHT EMITTING DEVICE HAVING PLURALITY OF NON-POLAR LIGHT EMITTING CELLS AND METHOD OF FABRICATING THE SAME

CROSS REFERENCE TO RELATED APPLICATION

This application is a divisional of U.S. patent application Ser. No. 12/624,011, filed on Nov. 23, 2009, and claims priority from and the benefit of Korean Patent Application No. 10-2008-0138422, filed on Dec. 31, 2008, all of which are hereby incorporated by reference for all purposes as if fully set forth herein.

BACKGROUND OF THE INVENTION

1. Field of the Invention

Exemplary embodiments of the present invention relate to a light emitting device and a method of fabricating the same, and more particularly, to a light emitting device having a plurality of non-polar light emitting cells and a method of fabricating the same.

2. Discussion of the Background

GaN-based light emitting diodes (LEDs) are widely used for displays and backlights. Further, LEDs have less electric power consumption and a longer lifespan as compared with conventional light bulbs or fluorescent lamps, so that the LEDs have been substituted for conventional incandescent bulbs and fluorescent lamps and their application areas have been expanded to the use thereof for general illumination.

In general, a GaN-based nitride semiconductor is grown on a heterogeneous substrate, such as a sapphire or silicon carbide substrate. The nitride semiconductor is mainly grown on a c-plane (0001) of such a substrate and has piezoelectric properties. A strong polarization electric field is generated in an active region of a multiple quantum well structure due to the piezoelectric properties. Therefore, it is difficult to increase the thickness of a light emitting layer, and there is a limitation in improving luminous power due to a decrease in light emitting recombination rate.

To prevent the generation of such a polarization electric field, a technique has been recently studied in which an a-plane nitride semiconductor is grown by machining GaN crystals grown on a c-plane sapphire substrate into a GaN substrate having a crystal face except the c-plane, e.g., an a-plane (11-20) or m-plane (1-100), and using the GaN substrate as a growth substrate of a nitride semiconductor, or using an m-plane silicon carbide substrate as a growth substrate. The nitride semiconductor with the a-plane or m-plane has non-polar or semi-polar properties. Accordingly, it is expected that the nitride semiconductor will improve luminous power as compared with a polar LED having a polarization electric field.

However, it costs a great deal to grow a nitride semiconductor using a GaN substrate grown on a sapphire substrate. Further, it is not easy to obtain a nitride semiconductor is that has crystallinity superior to that of a c-plane nitride semiconductor. Particularly, in the case of a high-output LED using high current, the output of a non-polar or semi-polar LED is relatively lower than that of the c-plane nitride semiconductor.

Meanwhile, LEDs generally emit light by forward current and require supply of DC current. Considering characteristics of LEDs operating under forward current, attempts have been made to develop a technique wherein a plurality of light emitting cells are driven by an AC power source by connecting the plurality of light emitting cells in reverse parallel or using a bridge rectifier, and the LEDs fabricated by the technique have been commercialized. Further, an LED has been developed which can emit high-output and high-efficiency light by a high-voltage DC power source by forming a plurality of light emitting cells on a single substrate and connecting them in series and in parallel. Such an LED can emit high-output and high-efficiency light by an AC or DC power source by forming a plurality of light emitting cells on a single substrate and connecting them through wires.

For example, LEDs capable of being connected to a high-voltage AC or DC power source using a plurality of light emitting cells are disclosed in PCT Patent Publication No. WO 2004/023568A1 (SAKAI et. al.), entitled "LIGHT-EMITTING DEVICE HAVING LIGHT-EMITTING ELEMENTS."

According to PCT Patent Publication No. WO 2004/023568A1, light emitting elements are two-dimensionally connected on a single insulative substrate such as a sapphire substrate to form arrays of light emitting elements. With such serial arrays, there may be provided a light emitting device capable of being driven by a high-voltage DC power source. Further, there may be provided a single-chip light emitting device capable of being driven by a high-voltage AC power source by connecting such arrays in reverse parallel.

However, since the light emitting device has light emitting elements (hereinafter, light emitting cells) formed on a substrate used as a growth substrate, e.g., a sapphire substrate, the light emitting cells have a limitation in structure, and there is a limitation in improving light extraction efficiency. To solve such a problem, a method of fabricating an AC-LED using a substrate separation process is disclosed in Korean Patent Publication No. 10-0599012, entitled "LIGHT EMITTING DIODE HAVING THERMAL CONDUCTIVE SUBSTRATE AND METHOD OF FABRICATING THE SAME."

According to the prior art, thermal dissipation performance of the LED can be improved since the substrate can be selected from a variety of substrates, and a light extraction efficiency can be enhanced by treating a surface of the n-type semiconductor layer. Further, since light traveling from light emitting cells toward a substrate is reflected using a reflective metal layer, the light emitting efficiency can be further improved.

However, in the prior art, while the semiconductor layers and the metal layers are patterned, etching byproducts of a metallic material are stuck to side walls of the light emitting cells, and therefore, a short circuit between the n-type semiconductor layer and p-type semiconductor layer may occur. Further, a surface of the metal layer, which is exposed while the semiconductor layers are etched, may be easily damaged by plasma. When the metal layer comprises a reflective metal layer such as Ag or Al, such etching damage may be serious. Since the surface of the metal layer is damaged by plasma, the adhesion of the wires or electrode pads formed on the metal layer is lowered, resulting in a device failure.

Furthermore, the etching damage may occur on the reflective metal layers that are exposed to a space between the light emitting cells, and the reflective metal layers may be easily oxidized due to their exposure to the outside. Particularly, the oxidation of the exposed is reflective metal layers is not limited to the exposed portions but progresses toward regions below the light emitting cells, thereby lowering reflectivity of the reflective metal layers.

SUMMARY OF THE INVENTION

Exemplary embodiments of the present invention provide a light emitting device having a plurality of non-polar light emitting cells and a method of fabricating the same.

Exemplary embodiments of the present invention also provide a light emitting device having a plurality of non-polar light emitting cells, which can have excellent crystallinity and save fabrication costs, and a method of fabricating the same.

Exemplary embodiments of the present invention also provide a light emitting device having a plurality of light emitting cells, in which a short circuit in a light emitting cell due to metallic etch byproducts can be prevented, and a method of fabricating the same.

Exemplary embodiments of the present invention also provide a light emitting device, in which a reflective metal layer can be prevented from being deteriorated due to etching or oxidation, and a method of fabricating the same.

Additional features of the invention will be set forth in the description which follows, and in part will be apparent from the description, or may be learned by practice of the invention.

An exemplary embodiment of the present invention discloses a method of fabricating a light emitting device having a plurality of non-polar light emitting cells, the method includes preparing a first substrate of sapphire or silicon carbide having an upper surface with an r-plane, an a-plane or an m-plane, the first substrate having stripe-shaped anti-growth patterns on the upper surface of the first substrate and recess regions, the anti-growth patterns defining is openings to expose the first substrate through the openings, the recess regions being positioned below the openings of the anti-growth patterns and having sidewalls of a c-plane. The method also includes growing nitride semiconductor layers on the first substrate having the recess regions, the nitride semiconductor layers being first grown from the sidewalls of the recess regions, and then being filled in the recess regions and covering the anti-growth patterns. The method also includes patterning the nitride semiconductor layers to form the light emitting cells separated from one another, the nitride semiconductor layers being removed from at least middle regions between the sidewalls and middle regions of the anti-growth patterns.

An exemplary embodiment of the present invention also discloses a method of fabricating a light emitting device having a plurality of non-polar light emitting cells, the method includes preparing a first substrate of sapphire or silicon carbide having an upper surface with an r-plane, an a-plane or an m-plane, the first substrate having stripe-shaped anti-growth patterns on the upper surface of the first substrate and recess regions, the anti-growth patterns defining openings to expose the first substrate through the openings, the recess regions being positioned below the openings of the anti-growth patterns and having sidewalls of a c-plane. The method also includes growing nitride semiconductor layers comprising a first conductive-type semiconductor layer and a second conductive-type semiconductor layer on the first substrate having the recess regions, the nitride semiconductor layers being first grown from the sidewalls of the recess regions, and then being filled in the recess regions and covering the anti-growth patterns. The method also includes forming an etching prevention layer on the nitride semiconductor layers, the etching prevention layer having openings through which the second conductive-type semiconductor layer is exposed, the etching prevention layer covering the nitride semiconductor layers at least in middle regions between the sidewalls and middle regions is of the anti-growth patterns. The method also includes forming electrodes filled in the openings of the etching prevention layer, the electrodes each having an extension extending toward a top surface of the etching prevention layer, the electrodes being spaced apart from one another. The method also includes forming an interlayer insulating layer on the electrodes; bonding a second substrate to the interlayer insulating layer; removing the first substrate and the anti-growth patterns to expose the first conductive-type semiconductor layer; and patterning the nitride semiconductor layers so that the etching prevention layer is exposed, thereby forming the plurality of light emitting cells spaced apart from one another.

An exemplary embodiment of the present invention also discloses a light emitting device having a plurality of non-polar light emitting cells, the light emitting device comprises a first substrate of sapphire or silicon carbide, the first substrate having stripe-shaped recess regions having sidewalls of a c-plane; and a plurality of non-polar light emitting cells spaced apart from one another by separation regions on the first substrate. Here, the separation regions comprise at least middle regions between sidewalls of the respective recess regions and middle regions between the recess regions.

An exemplary embodiment of the present invention also discloses a light emitting device comprising a substrate. A plurality of non-polar light emitting cells are positioned to be spaced apart from one another on the substrate, each of the light emitting cells having a first conductive-type upper semiconductor layer, an active layer and a second conductive-type lower semiconductor layer. An insulating layer is filled in spaces between the first conductive-type upper semiconductor layers of the light emitting cells. Wires for electrically connecting the light emitting cells to one another are disposed below the light emitting cells and the insulating layer. An interlayer insulating layer covers the wires and is interposed between the substrate and the light emitting cells.

An exemplary embodiment of the present invention also discloses a light emitting device comprising a substrate and a plurality of non-polar light emitting cells positioned on the substrate to be spaced apart from one another. Each of the light emitting cells comprises a first conductive-type upper semiconductor layer, an active layer and a second conductive-type lower semiconductor layer. Electrodes are positioned between the substrate and the light emitting cells to be spaced apart from one another, the electrodes being electrically connected to the corresponding second conductive-type lower semiconductor layers, and each of the electrodes having an extension extending toward an adjacent one of the light emitting cells. An etching prevention layer is positioned in regions between the light emitting cells and between the electrodes, the etching prevention layer having at least a portion extending toward a region below edges of adjacent light emitting cells, and the etching prevention layer having openings through which the extensions of the electrodes are exposed. A side insulating layer for covering sides of the light emitting cells is included in the light emitting device, as well as, wires for electrically connecting the light emitting cells. The wires being spaced apart from the sides of the light emitting cells by the side insulating layer, each have one end electrically connected to the upper semiconductor layer of one of the light emitting cells and the other end electrically connected to the electrode electrically connected to the lower semiconductor layer of another adjacent one of the light emitting cells, respectively, through the openings of the etching prevention layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Hereinafter, the invention will be described in detail with reference to the accompanying drawings, in which embodiments of the invention are shown. The following embodiments are provided so that this disclosure is thorough, and will fully convey the scope of the invention to those skilled in the art. Therefore, the invention should not be construed as limited to the following embodiments but may be implemented in other forms. In the drawings, the widths, lengths, thicknesses and the like of elements may be exaggerated for convenience of illustration. Like reference numerals indicate like elements throughout the specification and drawings.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

The term "non-polar" light emitting cell refers to a light emitting cell formed of a nitride semiconductor in which a polarization electric field is not induced by a piezoelectric field. However, except where indicated otherwise, the "non-polar" light emitting cell includes a light emitting cell formed of a "semi-polar" nitride semiconductor. Further, the term "non-polar nitride semiconductor" includes a semi-polar nitride semiconductor.

A method of fabricating a light emitting device according to the present invention comprises: partially etching a substrate so that sidewalls of recess regions of the substrate become a c-plane; forming nitride semiconductor layers for covering the substrate by growing the nitride semiconductor layers first from the sidewalls; and patterning the nitride semiconductor layers, thereby forming a plurality of non-polar light emitting cells. In this method, crystal defects are inevitably generated at specific locations by a growth technique in the growth of the nitride semiconductor layers, and the generated crystal defects are removed while patterning the nitride semiconductor layers.

According to this method, nitride semiconductors are first grown from the sidewalls of each recess region, and then grown in lateral directions of the first substrate. The nitride semiconductors continuously grown from the sidewalls come in contact with each other in a middle region between the sidewalls and a middle region of the anti-growth pattern. Accordingly, crystal defects such as dislocations are generated in these middle regions, and the dislocations are removed while patterning the nitride semiconductor layers.

Accordingly, a plurality of non-polar light emitting cells with excellent crystallinity can be obtained, and there may be provided various types of light emitting devices using the light emitting cells.

FIG. 1, FIG. 2, FIG. 3, FIG. 4, and FIG. 5 are sectional views illustrating a method of forming a plurality of non-polar light emitting cells according to an embodiment of the present invention.

Figure 1:
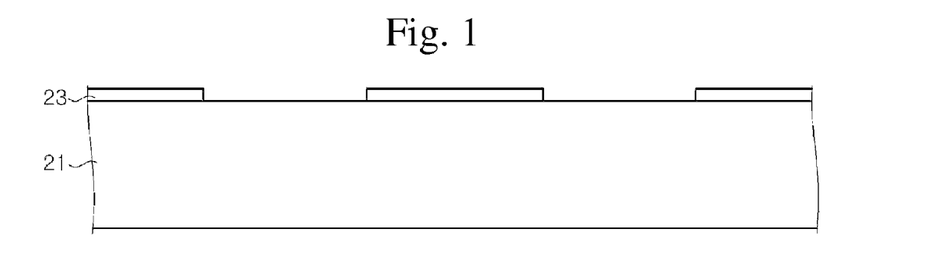
FIG. 1, FIG. 2, FIG. 3, FIG. 4, and FIG. 5 are sectional views illustrating a method of forming a plurality of non-polar light emitting cells on a single substrate according to an exemplary embodiment of the present invention.

Referring to FIG. 1, anti-growth patterns 23 are formed on a substrate 21. The substrate 21 may be a sapphire or silicon carbide substrate, and its upper surface may be a plane is different from a c-plane (0001) on which nitride semiconductors are generally grown, preferably an r-plane (1-102), an a-plane (11-20) or an m-plane (1-100). Each of these planes forms a certain intersection angle with respect to the c-plane. For example, the r-plane forms an intersection angle of less than 90 degrees with respect to the c-plane, and the a- and m-planes form right angles with the c-plane. The substrate 21 may be a conductive silicon carbide substrate, or an insulative silicon carbide or sapphire substrate, if necessary.

The anti-growth patterns 23 prevent a nitride semiconductor from being grown from the substrate 21, and for example, may be formed of silicon oxide or silicon nitride. The anti-growth patterns 23 define openings through which the substrate 21 is exposed, and are formed in the shape of a stripe.

Figure 2:
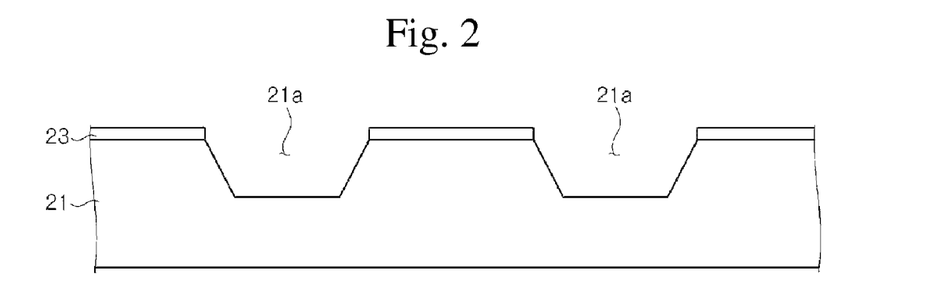

Referring to FIG. 2, stripe-shaped recess regions 21a are formed by etching the substrate 21 exposed by the anti-growth patterns 23. The recess regions 21a may be formed by etching the substrate 21 using the anti-growth patterns 23 as an etching mask. The c-plane on which ions are aggregated most densely forms a sidewall of the recess region 21a by the etching.

Although it has been described in this embodiment that the anti-growth patterns 23 are used as an etching mask for forming the recess regions 21a, alternatively, the recess regions 21a may be formed by using a different etching mask before the anti-growth patterns 23 are formed on the substrate 21. As a further alternative, an etching mask may be formed of a different material, e.g., photoresist, on the anti-growth patterns 23 to form the recess regions 21a.

Figure 3:
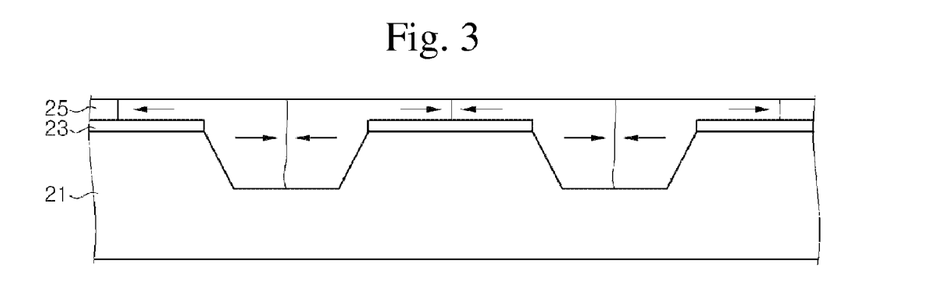

Referring to FIG. 3, a first conductive-type nitride semiconductor layer 25 is grown on the substrate 21 having the recess regions 21a. Before growing the first conductive-type nitride semiconductor layer 25, a nucleation layer and/or a buffer layer (not shown), formed of a nitride material, may be grown on the substrate 21.

The first conductive-type nitride semiconductor layer 25 is first grown from the c-planes that are the sidewalls of the recess regions 21a. Further, the first conductive-type nitride semiconductor layer 25 is prevented from being grown from the upper surface of the substrate 21 by the anti-growth patterns 23. As the growth of the first conductive-type nitride semiconductor layer 25 continues, nitride semiconductors formed from the sidewalls of the recess region 21a come in contact with each other in a middle region of the recess region 21a. Accordingly, crystal defects such as threading dislocations are generated in the first conductive-type nitride semiconductor layer 25 in the middle regions of the recess regions 21a. Further, as the growth of the first conductive-type nitride semiconductor layer 25 continues, nitride semiconductors formed from the sidewalls of the recess regions 21a are laterally grown on the anti-growth patterns 23, and accordingly, crystal defects such as threading dislocations are generated in the first conductive-type nitride semiconductor layer 25 in middle regions of the anti-growth patterns 23.

The widths of the anti-growth pattern 23 and the recess region 21a are selected such that positions at which the crystal defects are generated due to the contact of the growth planes of the nitride semiconductors become the middle regions of the recess region 21a and the anti-growth pattern 23.

Once the first conductive-type nitride semiconductor layer 25 covers the upper portion of the substrate 21, then nitride semiconductors are grown along the growth plane of the first conductive-type nitride semiconductor layer 25 that covers the upper portion of the substrate 21. Since the growth plane has the same intersection angle as that formed by the upper surface of the substrate 21 with respect to the c-plane that is the sidewall of the recess region 21a, the growth plane is the same crystal plane as the upper surface of the substrate 21, whereby is non-polar nitride semiconductor layers are formed.

Figure 4:
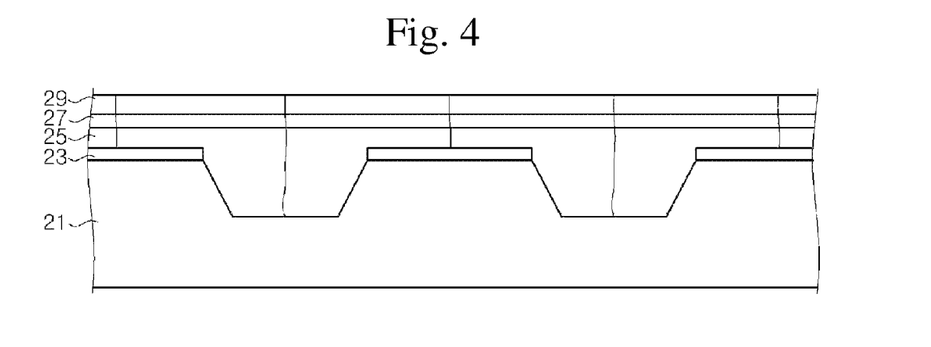

Referring to FIG. 4, an active layer 27 and a second conductive-type nitride semiconductor layer 29 are grown on the first conductive-type nitride semiconductor layer 25. The first conductive-type nitride semiconductor layer 25, the active layer 27 and the second conductive-type nitride semiconductor layer 29 may be formed of a III-N compound semiconductor and grown by a process such as metal organic chemical vapor deposition (MOCVD) or molecular beam epitaxy (MBE).

The active layer 27 and the second conductive-type nitride semiconductor layer 29 are grown along the growth plane of the first conductive-type nitride semiconductor layer 25, and accordingly, non-polar nitride semiconductor layers are grown. At this time, crystal defects generated in the first conductive-type nitride semiconductor layer 25 may be transferred to the active layer 27 and the second conductive-type nitride semiconductor layer 29.

The first conductive-type nitride semiconductor and the second conductive-type nitride semiconductor may be n-type and p-type or p-type and n-type, respectively. Preferably, the first conductive-type nitride semiconductor is an n-type and the second conductive-type nitride semiconductor is a p-type.

The active layer 27 may be formed to have a multiple quantum well structure, and the first conductive-type nitride semiconductor layer 25 and the second conductive-type nitride semiconductor layer 29 may be formed to have a single- or multi-layered structure.

Figure 5:
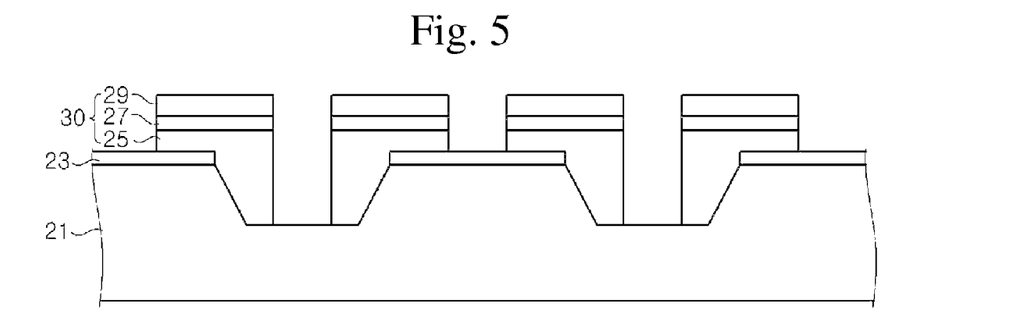

Referring to FIG. 5, a plurality of light emitting cells 30 are formed by patterning the nitride semiconductor layers including the first conductive-type nitride semiconductor layer 25, the active layer 27 and the second conductive-type nitride semiconductor layer 29. At this time, the nitride semiconductor layers 25, 27 and 29 are removed in the middle regions between is the sidewalls of the respective recess regions 21a and in the middle regions of the respective anti-growth patterns 23.

That is, a plurality of non-polar light emitting cells 30 are spaced apart from one another on the substrate 21 by separation regions formed by removing portions of the nitride semiconductor layers 25, 27 and 29. The separation regions comprise the middle regions between the sidewalls of the respective recess regions 21a and the middle regions between the adjacent recess regions 21a. Accordingly, the crystal defects are removed, which were generated by the contact of the crystals of the first conductive-type nitride semiconductor layer 25 grown from the sidewalls of the recess regions 21a.

The light emitting cell 30 may have an elongate shape along the recess region 21a. Alternatively, the nitride semiconductor layers 25, 27 and 29 may be removed in regions that intersect the recess regions 21a, and a plurality of light emitting cells 30 spaced apart from one another may be formed along the recess regions 21a.

Various types of circuits can be formed by electrically connecting the light emitting cells 30 through wires. Further, various types of light emitting devices each having a plurality of non-polar light emitting cells 30, such as a flip chip or a light emitting device in which the growth substrate has been removed, can be provided by attaching the light emitting cells 30 to a submount or a bonding substrate.

Figure 6:
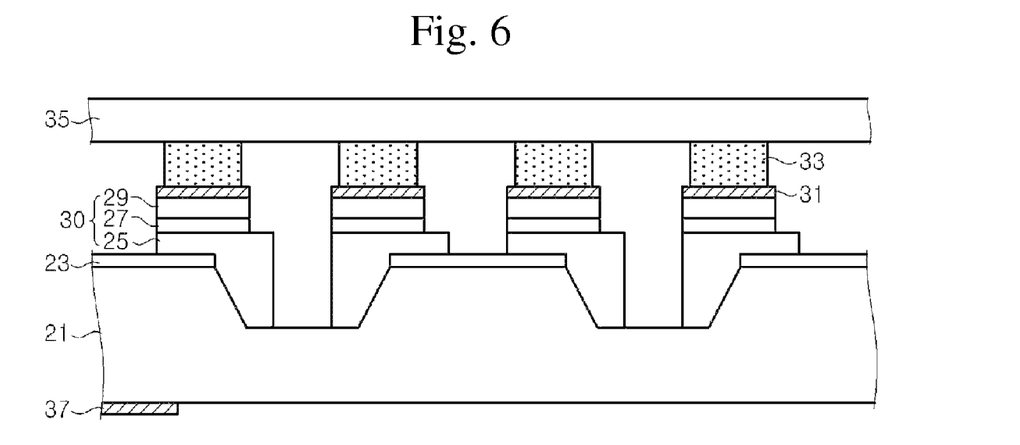
FIG. 6 is a sectional view illustrating a method of fabricating a light emitting device having a plurality of non-polar light emitting cells according to a first embodiment of the present invention.

FIG. 6 is a sectional view illustrating a method of fabricating a light emitting device having a plurality of non-polar light emitting cells 30 according to a first embodiment of the present invention.

Referring to FIG. 6, reflective metal layers 31 are formed on the light emitting cells 30, respectively. The reflective metal layer 31 may be formed, for example of Ag or Al. Further, the reflective metal layer 31 may be formed on a portion of the light emitting cell 30, and a protective metal layer (not shown) may be formed to cover the reflective metal layer 31.

A second substrate 35 is bonded to the reflective metal layer 31 through bumps 33. The second substrate 35 may be a submount substrate, for example. The second substrate 35 may have an electric circuit therein. The substrate 21 may be a conductive silicon carbide substrate, and an electrode pad 37 may be formed under a lower surface of the substrate 21. Accordingly, there is provided a flip chip having the non-polar light emitting cells 30 flip-bonded to the submount substrate 35. The flip chip may be formed by forming the plurality of light emitting cells 30 on the substrate 21, separating the substrate 21 into single chips and then bonding the separated chips to the submount substrate 35.

FIG. 7, FIG. 8, FIG. 9, and FIG. 10 are sectional views illustrating a method of fabricating a light emitting device having a plurality of non-polar light emitting cells according to a second embodiment of the present invention.

Figure 7:
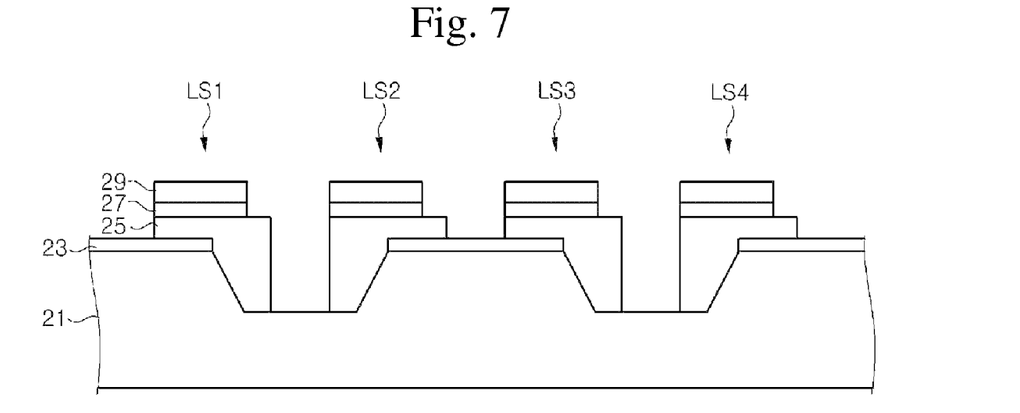
FIG. 7, FIG. 8, FIG. 9, and FIG. 10 are sectional views illustrating a method of fabricating a light emitting device having a plurality of non-polar light emitting cells according to a second embodiment of the present invention.

Referring to FIG. 7, nitride semiconductor layers 25, 27 and 29 are grown on a substrate 21 as described with reference to FIG. 1, FIG. 2, FIG. 3, and FIG. 4. Then, the nitride semiconductor layers 25, 27 and 29 are etched to form light emitting cells LS1, LS2, LS3 and LS4 separated from one another. The first conductive-type nitride semiconductor layer 25 is partially exposed by removing portions of the second conductive-type nitride semiconductor layer 29 and the active layer 27. That is, each of the light emitting cells LS1, LS2, LS3 and LS4 comprises the first conductive-type nitride semiconductor layer 25, the second conductive-type nitride semiconductor layer 29 positioned on one region of the first conductive-type nitride semiconductor layer 25, and the active layer 27 interposed between the first conductive-type nitride semiconductor layer 25 and the second conductive-type nitride is semiconductor layer 29. A process of partially exposing the first conductive-type nitride semiconductor layer 25 is known as a mesa etching process.

Figure 8:
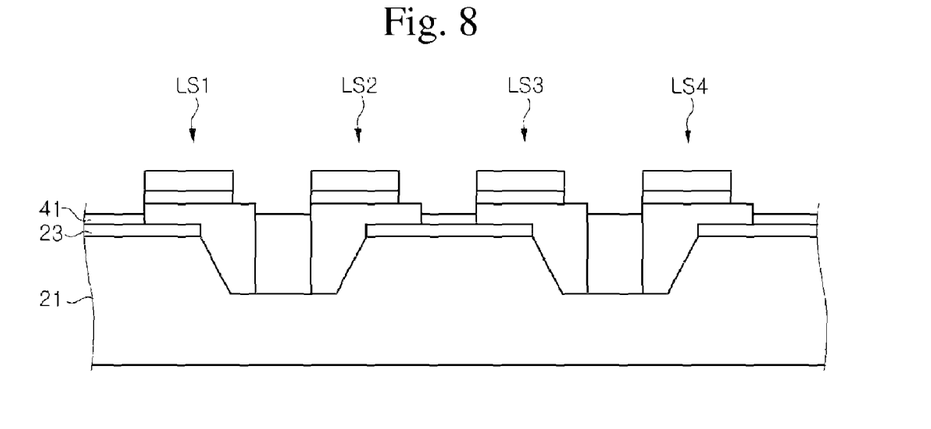

Referring to FIG. 8, a first insulating layer 41 is formed to be filled in spaces between the light emitting cells LS1, LS2, LS3 and LS4. The first insulating layer 41 is positioned below the upper surface of the first conductive-type nitride semiconductor layer 25. The first insulating layer 41 may be formed of an insulating material, such as Spin-on-glass (SOG). The first insulating layer 41 may be formed by applying or depositing an insulating material on the light emitting cells LS1, LS2, LS3 and LS4 and partially removing the insulating material such that the upper surface of the first conductive-type nitride semiconductor layer 25 is exposed. The first insulating layer 41 may be formed to reduce a step difference between the light emitting cells LS1, LS2, LS3 and LS4, or may be omitted.

Figure 9:
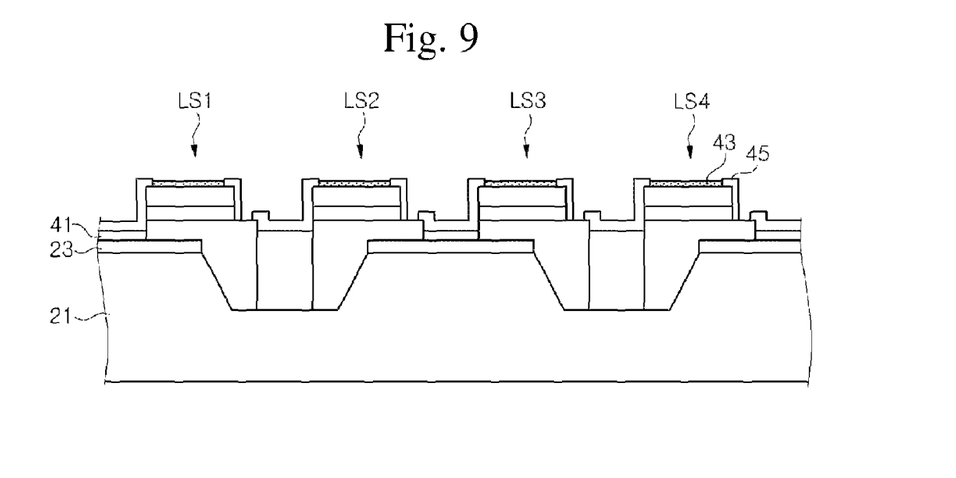

Referring to FIG. 9, a second insulating layer 45 for covering sides of the light emitting cells LS1, LS2, LS3 and LS4 is formed on the first insulating layer 41. The second insulating layer 45 has openings through which upper portions of the light emitting cells LS1, LS2, LS3 and LS4 are exposed and also has openings through which upper surfaces of the first conductive-type nitride semiconductor layers 25 are exposed. When the first insulating layer 41 is omitted, the second insulating layer 45 covers a side of the first conductive-type nitride semiconductor layer 25 in the recess region 21a.

Transparent electrode layers 43 are formed on the light emitting cells LS1, LS2, LS3 and LS4, e.g., on the second conductive-type nitride semiconductor layers 29. The transparent electrode layers 43 may be formed before the second insulating layer 45 is formed. The transparent electrode layer 43 may be formed of a transparent oxide such as indium tin oxide (ITO) or a transparent metal such as Ni/Au Referring to FIG. 10, wires 47 are formed to connect the light emitting cells LS1, LS2, LS3 and LS4. A serial array may be formed by connecting the light emitting cells LS1, LS2, LS3 and LS4 in series through the wires 47. At least two serial arrays may be connected in reverse parallel by wires 47. Accordingly, there is provided an AC light emitting device that may be driven by a high-voltage AC power source. Further, the light emitting cells LS1, LS2, LS3 and LS4 may be connected in parallel through the wires 47. The light emitting cells LS1, LS2, LS3 and LS4 can be connected as various types of circuits by the wires 47. Through various connections using the wires 47, there are provided various light emitting devices that may be driven by an AC or DC power source.

Figure 11:
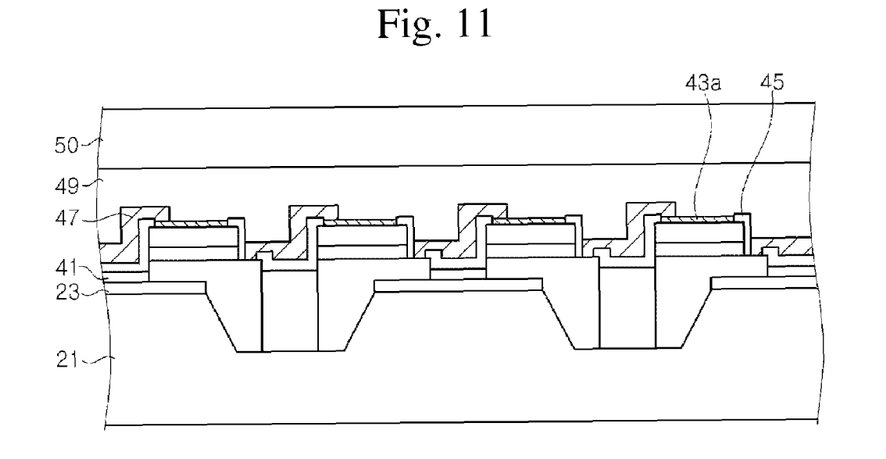
FIG. 11 is a sectional view illustrating a method of fabricating a light emitting device having a plurality of non-polar light emitting cells according to a third embodiment of the present invention.

FIG. 11 is a sectional view illustrating a method of fabricating a light emitting device having a plurality of non-polar light emitting cells LS1, LS2, LS3 and LS4 according to a third embodiment of the present invention.

Figure 10:
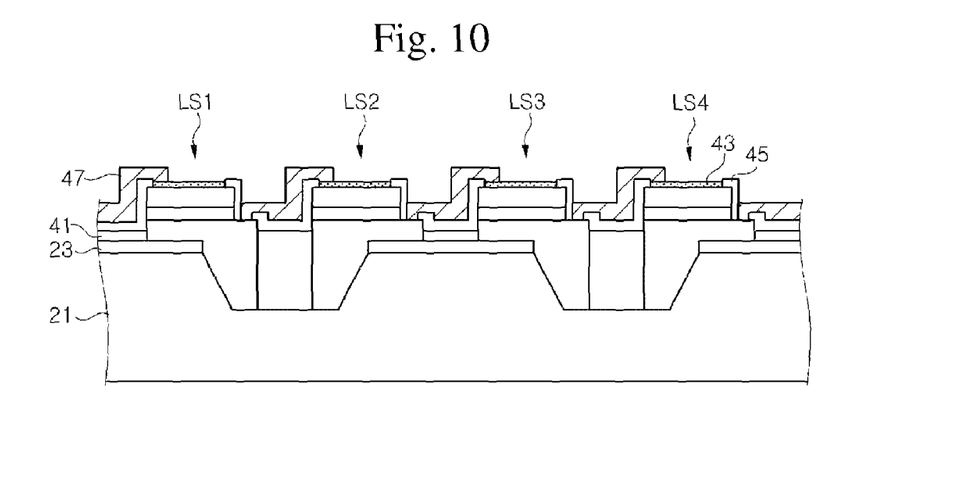

Referring to FIG. 11, after the wires 47 of FIG. 10 are formed, an interlayer insulating layer 49 is formed to cover the light emitting cells LS1, LS2, LS3 and LS4. The interlayer insulating layer 49 prevents the light emitting cells LS1, LS2, LS3 and LS4 from being short-circuited. A second substrate 50 is bonded to the interlayer insulating layer 49.

The second substrate 50 may be a submount substrate, and accordingly, there may be provided a flip-chip light emitting device. The submount substrate may have electrode pads, and pads (not shown) for supplying power to the light emitting cells LS1, LS2, LS3 and LS4 may be electrically connected to the electrode pads on the submount substrate through the interlayer insulating layer 49. In this case, light emitted from the light emitting cells LS1, LS2, LS3 and LS4 is emitted toward the substrate 21. Accordingly, a reflective metal layer 43a is preferably formed rather than the transparent electrode layer 43.

Alternatively, the interlayer insulating layer 49 may be omitted, and the light emitting cells LS1, LS2, LS3 and LS4 may be bonded to the submount substrate.

Figure 12:
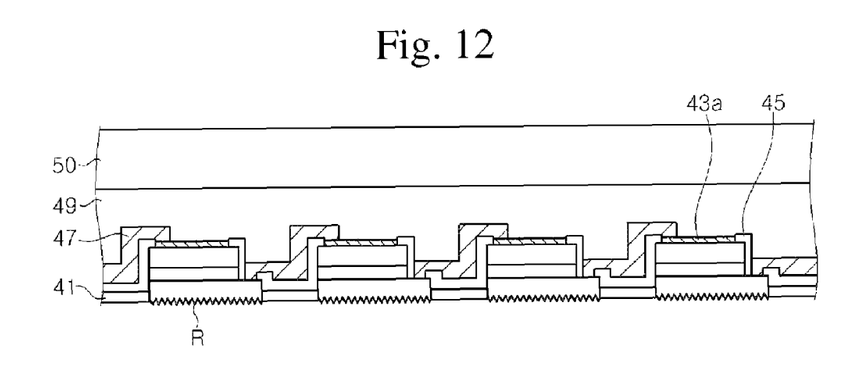
FIG. 12 is a sectional view illustrating a method of fabricating a light emitting device having a plurality of non-polar light emitting cells according to a fourth embodiment of the present invention.

FIG. 12 is a sectional view illustrating a method of fabricating a light emitting device having a plurality of non-polar light emitting cells according to a fourth embodiment of the present invention.

Referring to FIG. 12, after the second substrate 50 of FIG. 11 is bonded, the substrate 21 is removed. The substrate 21 may be removed by a polishing or etching process. The anti-growth patterns 23 may also be removed, and the lower surfaces of the first conductive-type nitride semiconductor layers 25 are exposed. The first conductive-type nitride semiconductor layers 25 may be planarized.

If the light emitting device is turned over such that the second substrate 50 faces downward and the first conductive-type nitride semiconductor layers 25 face upward, light is emitted upward. Therefore, the first conductive-type nitride semiconductor layer 25 and the second conductive-type nitride semiconductor layer 29 become upper semiconductor layer and lower semiconductor layer, respectively. The first insulating layer 41 is filled in the spaces between the first conductive-type nitride semiconductor layers 25, and the wires 47 are disposed below the first insulating layer 41.

In addition, a roughened surface R may be formed on the exposed surface of the first conductive-type nitride semiconductor layer 25. The roughened surface R may be formed by photoelectrochemical (PEC) etching or the like.

Figure 13:
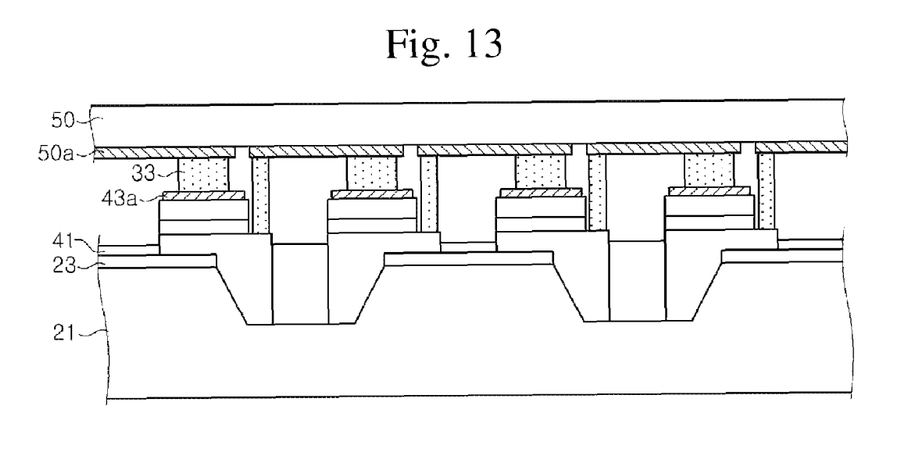
FIG. 13 is a sectional view illustrating a method of fabricating a light emitting device having a plurality of non-polar light emitting cells according to a fifth embodiment of the is present invention.

FIG. 13 is a sectional view illustrating a method of fabricating a light emitting device having a plurality of non-polar light emitting cells according to a fifth embodiment of the present invention.

Referring to FIG. 13, after the first insulating layer 41 of FIG. 8 is formed, reflective layers 43a are formed on the light emitting cells LS1, LS2, LS3 and LS4 as described with reference to FIG. 6. Here, the second substrate 50 has electrode patterns 50a. The electrode patterns 50a are formed corresponding to the light emitting cells LS1, LS2, LS3 and LS4, respectively.

The light emitting cells LS1, LS2, LS3 and LS4 are electrically connected to the electrode patterns 50a through bumps 33, respectively. The first conductive-type nitride semiconductor layer 25 and second conductive-type nitride semiconductor layer 29 of one of the light emitting cells LS1, LS2, LS3 and LS4, e.g., the light emitting cell LS1, are connected to adjacent electrode patterns 50a, respectively. With such connections, the light emitting cells can be connected in series using the bumps 33 and the electrode patterns 50a.

Alternatively, the light emitting cells LS1, LS2, LS3 and LS4 may be connected in parallel by electrically connecting the first conductive-type nitride semiconductor layers 25 to one another and electrically connecting the second conductive-type nitride semiconductor layers 29 to one another.

FIG. 14, FIG. 15, FIG. 16, FIG. 17, FIG. 18, FIG. 19, and FIG. 20 are sectional views illustrating a method of fabricating a light emitting device having a plurality of non-polar light emitting cells LS1, LS2, LS3 and LS4 according to another embodiment of the present invention. In the aforementioned light emitting devices, the light emitting cells LS1, LS2, LS3 and LS4 are separated from one another on the substrate 21. However, in the light emitting device according to this embodiment, nitride semiconductor layers are separated from the substrate 21, and light emitting cells LS1, LS2, LS3 and LS4 are then separated from one another. In addition, a process of preventing metallic etching byproducts from being produced will be described.

Figure 14:
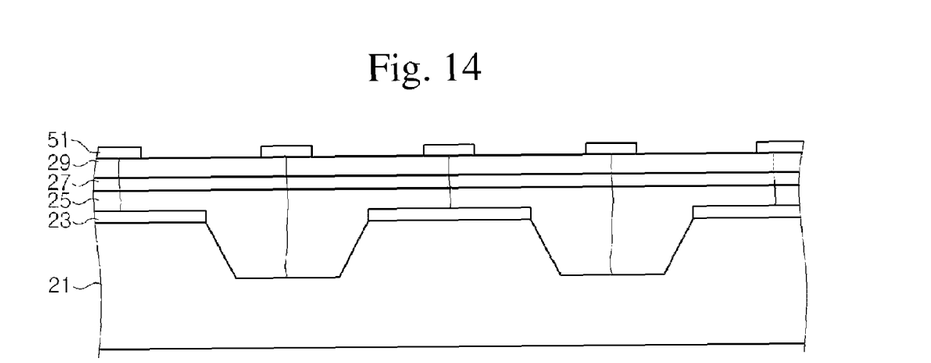
FIG. 14, FIG. 15, FIG. 16, FIG. 17, FIG. 18, FIG. 19, and FIG. 20 are sectional views illustrating a method of fabricating a light emitting device having a plurality of non-polar light emitting cells according to another exemplary embodiment of the present invention.

Referring to FIG. 14, an etching prevention layer 51 is formed on the nitride semiconductor layers 25, 27 and 29 of FIG. 4, e.g., on the second conductive-type nitride semiconductor layer 29. The etching prevention layer 51 covers the nitride semiconductor layers 25, 27 and 29 on middle regions between the sidewalls of respective recess regions 21a and on middle regions of the respective anti-growth patterns 23. Further, the etching prevention layer 51 covers regions across the anti-growth patterns 23, thereby defining openings through which the second conductive-type nitride semiconductor layer 29 is exposed. The openings are formed corresponding to respective regions of light emitting cells LS1, LS2, LS3 and LS4 to be formed later and each of the openings are formed to have a smaller area than that of the corresponding light emitting cell LS1, LS2, LS3 and LS4.

The etching prevention layer 51 may be formed by forming an insulating layer such as a silicon oxide layer or a silicon nitride layer on the second conductive-type nitride semiconductor layer 29 and then patterning the insulating layer using photolithography and etching processes.

Figure 15:
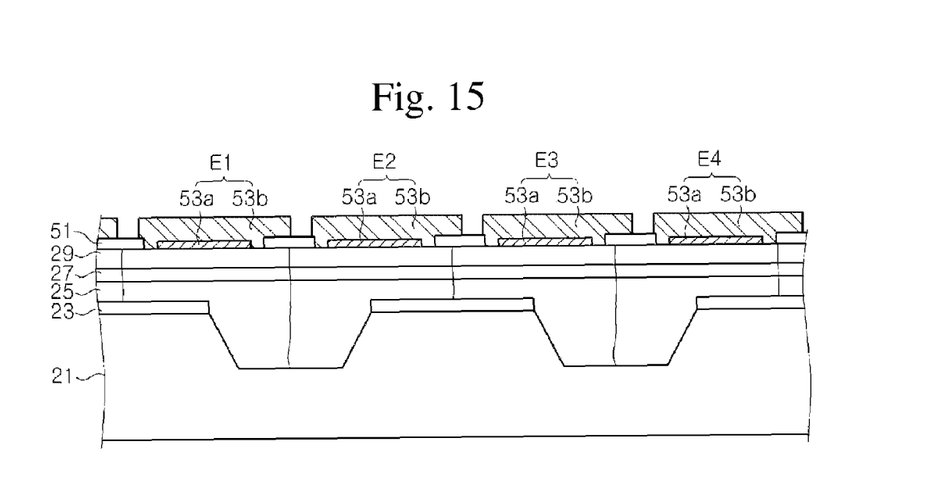

Referring to FIG. 15, reflective layers 53a are formed in the openings of the etching prevention layer 51. The reflective layers 53a may be formed of a metallic material having high reflectivity, e.g., Ag, Al or an alloy thereof. The reflective layers 53a may be formed by laminating layers having different refractive indices from each other. When the reflective layer 53a is formed of a metal layer, it may be formed using a plating or depositing technique, e.g., a lift-off process. Before forming the reflective layers 53a, an ohmic contact layer (not shown) may be formed on the second conductive-type nitride semiconductor layer 29. Alternatively, the reflective layers 53a may be formed before forming the etching prevention is layer 51.

Subsequently, protective metal layers 53b are formed to cover the reflective layers 53a. The protective metal layers 53b are filled in the openings of the etching prevention layer 51 and extend upward from the etching prevention layer 51. The protective metal layers 53b are formed to be spaced apart from one another. The protective metal layers 53b may be formed to have a single- or multi-layered structure. For example, the protective metal layers 53b may be formed of Ni, Ti, Ta, Pt, W, Cr, Pd or the like.

In this embodiment, the reflective layers 53a and the protective metal layers 53b constitute electrodes E1, E2, E3 and E4. However, the electrodes E1, E2, E3 and E4 are not limited thereto but may be formed of single metal layers. For example, the formation of the reflective layers 53a may be omitted, and electrodes E1, E2, E3 and E4 may comprise only the protective metal layers 53b.

Figure 16:
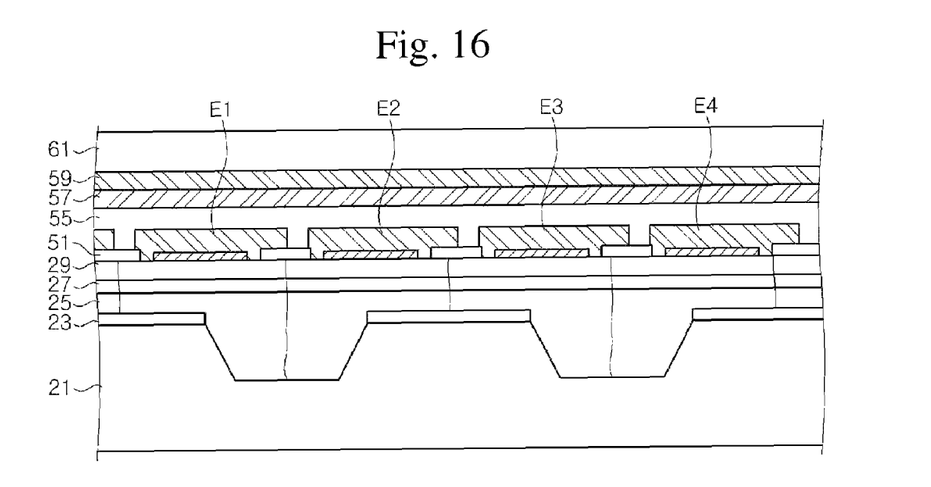

Referring to FIG. 16, an interlayer insulating layer 55 is formed on the electrodes E1, E2, E3 and E4. The interlayer insulating layer 55 may cover the electrodes E1, E2, E3 and E4 and be filled in gaps between the electrodes E1, E2, E3 and E4. The material of the interlayer insulating layer 55 may be formed of any suitable insulating material, such as a silicon oxide layer or a silicon nitride layer.

A bonding metal 57 is formed on the interlayer insulating layer 55, and a bonding metal 59 is formed on a second substrate 61. The bonding metal 57 may be formed of AuSn (80/20 wt %), for example. The second substrate 61 is not particularly limited but may be a substrate, e.g., a sapphire substrate, which has a thermal expansion coefficient identical to that of the substrate 21.

The bonding metals 57 and 59 are bonded to face each other, so that the second is substrate 61 is bonded to the interlayer insulating layer 55.

Figure 17:
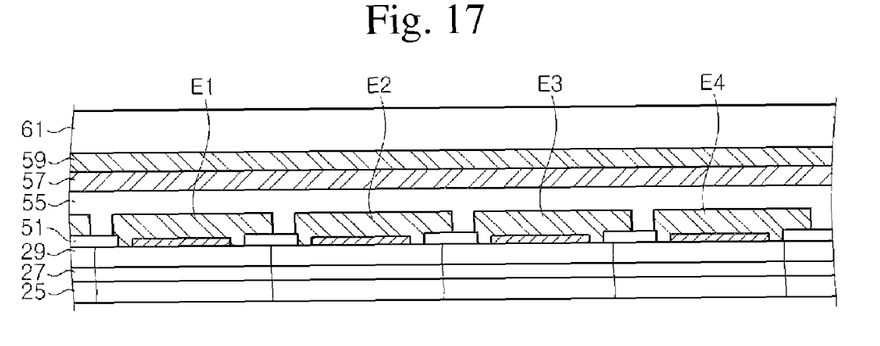

Referring to FIG. 17, the substrate 21 is removed, and the first conductive-type nitride semiconductor layer 25 is exposed. The substrate 21 may be separated using a laser lift-off (LLO) technique or other mechanical or chemical methods, e.g., a polishing or etching technique. The anti-growth patterns 23 may also be removed. Accordingly, the first conductive-type nitride semiconductor layer 25 is exposed, and the exposed surface thereof may be planarized.

Figure 18:
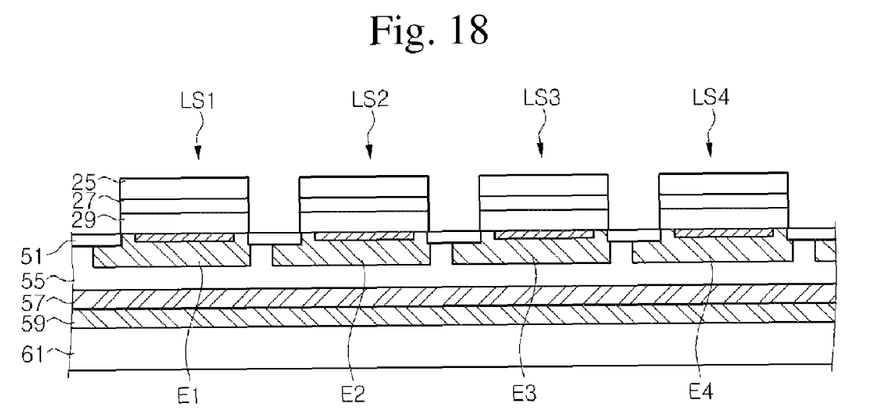

Referring to FIG. 18, a plurality of light emitting cells LS1, LS2, LS3 and LS4 are formed by patterning the nitride semiconductor layers 25, 27 and 29. Each of the light emitting cells LS1, LS2, LS3 and LS4 comprises a patterned first conductive-type nitride semiconductor layer 25, a patterned active layer 27 and a patterned second conductive-type nitride semiconductor layer 29. The compound semiconductor layers 25, 27 and 29 may be patterned using photolithography and etching processes. At this time, portions of the nitride semiconductor layers 25, 27 and 29 that are between the light emitting cells LS1, LS2, LS3 and LS4 are removed by the etching process, and the etching prevention layer 51 is exposed. The etching prevention layer 51 prevents the electrodes E1, E2, E3 and E4 formed thereunder from being exposed during the etching process. To this end, the etching process is performed in a limited region on the etching prevention layer 51. While separating the light emitting cells LS1, LS2, LS3 and LS4, the portions of the nitride semiconductor layers 25, 27 and 29 that contain the crystal defects, are removed.

Figure 19:
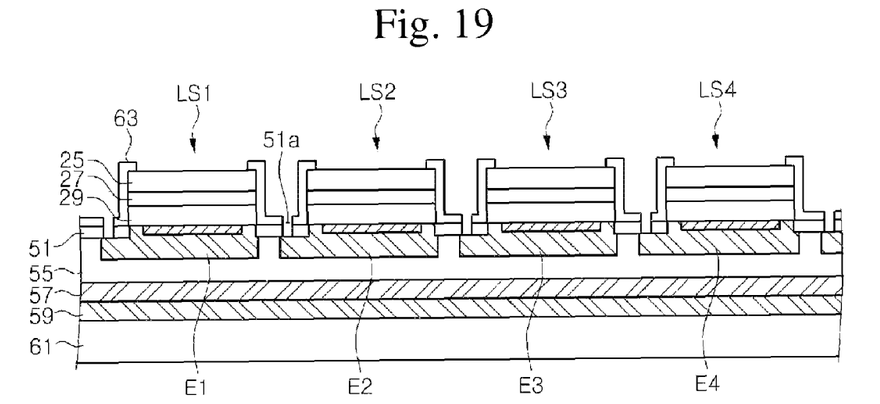

Referring to FIG. 19, a side insulating layer 63 is formed to cover sides of the light emitting cells LS1, LS2, LS3 and LS4. The side insulating layer 63 may be formed by forming an insulating layer for covering the light emitting cells LS1, LS2, LS3 and LS4 and then is patterning the insulating layer using photolithography and etching processes. The side insulating layer 63 may be formed of $SiO_2$, SiN, MgO, TaO, $TiO_2$ or a polymer, for example. The side insulating layer 63 covers sides of the first conductive-type nitride semiconductor layer 25, the active layer 27 and the second conductive-type nitride semiconductor layer 29, i.e., the exposed sides of the light emitting cells LS1, LS2, LS3 and LS4. Further, as shown in this figure, the side insulating layer 63 may also cover portions of the top surfaces of the light emitting cells LS1, LS2, LS3 and LS4. Furthermore, the side insulating layer 63 may extend to an upper portion of the etching prevention layer 51. While or after the side insulating layer 63 is formed, openings 51a are formed in the etching prevention layer 51 to expose extensions of the electrodes E1, E2, E3 and E4.

Figure 20:
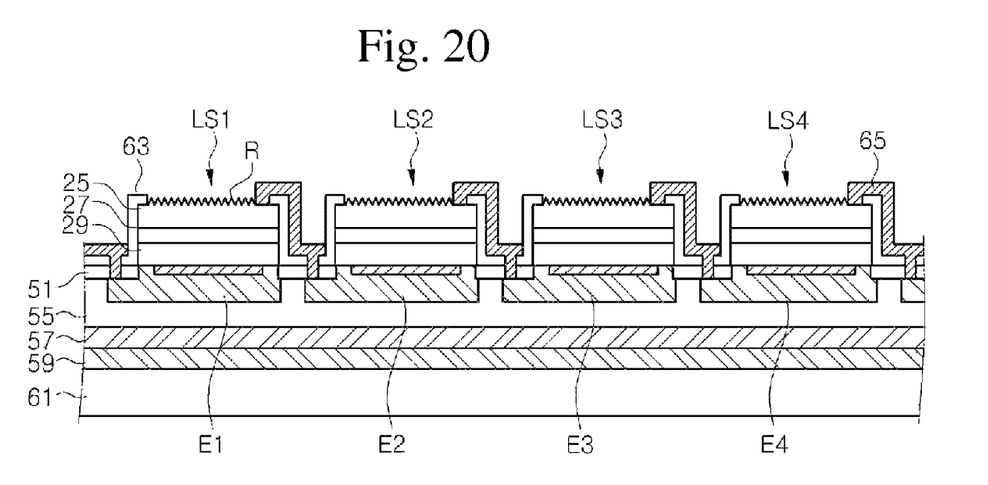

Referring to FIG. 20, wires 65 are formed to electrically connect the light emitting cells LS1, LS2, LS3 and LS4. The wires 65 may connect the light emitting cells LS1, LS2, LS3 and LS4 in series. For example, the wires 65 may electrically connect first conductive-type nitride semiconductor layer 25 of the light emitting cell LS1 to the electrode E2 that is electrically connected to the second conductive-type nitride semiconductor layer 29 of the light emitting cell LS2, the first conductive-type nitride semiconductor layer 25 of the light emitting cell LS2 to the electrode E3 that is electrically connected to the second conductive-type nitride semiconductor layer 29 of the light emitting cell LS3, and the first conductive-type nitride semiconductor layer 25 of the light emitting cell LS3 to the electrode E4 that is electrically connected to the second conductive-type nitride semiconductor layer 29 of the light emitting cell LS4. Accordingly, an array of the light emitting cells LS1, LS2, LS3 and LS4 connected in series is formed.

Each of the wires 65 has one end electrically connected to the first is conductive-type nitride semiconductor layer 25 of one of the light emitting cells, e.g., the light emitting cell LS1, and the other end electrically connected to the electrode E2 that is electrically connected to the second conductive-type nitride semiconductor layer 29 of another adjacent one of the light emitting cells, e.g., the light emitting cell LS2.

At least two serial arrays may be formed on the substrate 61 by the wires 65. These arrays may be connected to each other in reverse parallel, thereby they may be driven by an AC power source. Alternatively, a serial array is formed on the substrate 61 by the wires 65 and connected to a bridge rectifier formed on the substrate, thereby the serial array may be driven by an AC power source. The bridge rectifier may also be formed by connecting light emitting cells LS1, LS2, LS3 and LS4 through wires 65. Alternatively, a serial array of light emitting cells LS1, LS2, LS3 and LS4 may also be driven by a high-voltage DC power source.

Before the wires 65 are formed, pads (not shown) may be formed on the first conductive-type nitride semiconductor layers 25 and/or the electrodes E1, E2, E3 and E4 to improve the adhesion or ohmic contact property of the wires 65.

The wires 65 may connect the first conductive-type nitride semiconductor layers 25 of the light emitting cells LS1, LS2, LS3 and LS4 to one another. In such a case, the electrodes E1, E2, E3 and E4 may be connected to one another. Accordingly, there may be provided a light emitting device having a plurality of light emitting cells LS1, LS2, LS3 and LS4 connected in parallel.

Roughened surfaces R may be formed on the first conductive-type nitride semiconductor layers 25 of the light emitting cells LS1, LS2, LS3 and LS4 using a PEC etching process or the like. The roughened surfaces R may be formed before the wires 65 are formed.

According to exemplary embodiments of the present invention, there may be is provided a light emitting device having a plurality of non-polar light emitting cells LS1, LS2, LS3 and LS4. Particularly, there may be provided a light emitting device which can have excellent crystallinity and save fabrication costs since a c-plane of a sapphire or silicon carbide substrate is used as a growth plane. Further, while separating light emitting cells LS1, LS2, LS3 and LS4, the exposure of a metal can be prevented, thereby making it possible to prevent an electrical short circuit in the light emitting cells caused by metallic etching byproducts and to prevent a reflective metal layer from being deformed by etching or oxidation.

All publications, patent applications, accession numbers and other references cited in this specification are herein incorporated by reference as if each individual publication or patent application were specifically and individually indicated to be incorporated by reference.

Although the present invention has been described in connection with illustrated embodiments, the present invention is not to be construed as limited to the aforementioned embodiments. It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting device comprising a plurality of non-polar light emitting cells, the light emitting device comprising:
    a first substrate comprising sapphire or silicon carbide, the first substrate further comprising stripe-shaped recess regions having sidewalls of a c-plane; and
    a plurality of non-polar light emitting cells spaced apart from one another by separation regions on the first substrate,
    wherein the separation regions comprise at least middle regions between sidewalls of the respective said stripe-shaped recess regions and middle regions between adjacent said stripe-shaped recess regions.

2. The light emitting device of claim 1, wherein the upper surface of the first substrate is an r-plane, an a-plane or an m-plane.

3. The light emitting device of claim 1, further comprising:
    a second substrate; and
    bumps disposed on the plurality of non-polar light emitting cells and interposed between the plurality of non-polar light emitting cells and the second substrate.

4. The light emitting device of claim 3, further comprising reflective layers disposed on the plurality of non-polar light emitting cells and interposed between the bumps and the plurality of non-polar light emitting cells.

5. The light emitting device of claim 1, wherein each plurality of non-polar light emitting cells comprises a first conductive-type semiconductor layer, a second conductive-type semiconductor layer partially positioned on the first conductive-type semiconductor layer, and an active layer disposed on the first conductive-type semiconductor layer and interposed between the first and second conductive-type semiconductor layers.

6. The light emitting device of claim 5, further comprising wires electrically connecting the plurality of non-polar light emitting cells.

7. The light emitting device of claim 6, wherein the plurality of non-polar wires connect the light emitting cells in parallel.

8. The light emitting device of claim 6, wherein the plurality of non-polar wires connect the light emitting cells in series.

9. The light emitting device of claim 6, further comprising an insulating layer covering sides of the plurality of non-polar light emitting cells, the insulating layer comprising openings that expose the second conductive-type semiconductor layers of the plurality of non-polar light emitting cells.

10. The light emitting device of claim 9, wherein the insulating layer further comprises openings that expose the first conductive-type semiconductor layers of the plurality of non-polar light emitting cells.

11. The light emitting device of claim 6, further comprising a first insulating layer disposed in the separation regions between the plurality of non-polar light emitting cells, the first insulating layer being positioned below the upper surfaces of the first conductive-type semiconductor layers;
    and a second insulating layer covering the sides of the plurality of non-polar light emitting cells and disposed on the first insulating layer.

12. The light emitting device of claim 6, further comprising:
    a second substrate; and
    an interlayer insulating layer disposed on the first substrate and interposed between the second substrate and the plurality of non-polar light emitting cells electrically connected by the wires.

13. The light emitting device of claim 1, further comprising:
    a second substrate comprising electrode patterns; and
    bumps disposed on the first substrate and interposed between the plurality of non-polar light emitting cells and the electrode patterns, wherein the plurality of non-polar light emitting cells are electrically connected to one another by the bumps and the electrode patterns.

14. A light emitting device comprising a plurality of non-polar light emitting cells, the light emitting device comprising:
a substrate;
a plurality of non-polar light emitting cells positioned to be spaced apart from one another on the substrate, each of said plurality of the light emitting cells comprising a first conductive-type upper semiconductor layer, an active layer, and a second conductive-type lower semiconductor layer;
an insulating layer disposed between the first conductive-type upper semiconductor layers of the plurality of non-polar light emitting cells;
wires electrically connecting the plurality of non-polar light emitting cells to one another; and
an interlayer insulating layer covering the wires and interposed between the substrate and the plurality of non-polar light emitting cells.

15. The light emitting device of claim 14, wherein the wires connect the plurality of non-polar light emitting cells in series.

16. The light emitting device of claim 14, wherein the first conductive-type upper semiconductor layer has a roughened surface.

17. A light emitting device comprising a plurality of non-polar light emitting cells, the light emitting device comprising:
a substrate;
a plurality of non-polar light emitting cells positioned on the substrate to be spaced apart from one another, each of the plurality of non-polar light emitting cells comprising a first conductive-type upper semiconductor layer, an active layer, and a second conductive-type lower semiconductor layer;
electrodes disposed between the substrate and the plurality of non-polar light emitting cells to be spaced apart from one another, the electrodes being electrically connected to the corresponding second conductive-type lower semiconductor layers, each of the electrodes having an extension extending toward an adjacent one of the plurality of non-polar light emitting cells;
an etching prevention layer disposed between plurality of non-polar light emitting cells and between adjacent electrodes, the etching prevention layer comprising at least a portion extending below edges of adjacent plurality of non-polar light emitting cells, and the etching prevention layer comprising openings that expose the extensions of the electrodes;
a side insulating layer covering sides of the plurality of non-polar light emitting cells; and
wires electrically connecting the plurality of non-polar light emitting cells, the wires being spaced apart from the sides of the plurality of non-polar light emitting cells by the side insulating layer, each of the wires having one end electrically connected to the first conductive-type upper semiconductor layer of one of the plurality of non-polar light emitting cells and the other end electrically connected to the electrode that is electrically connected to the second conductive-type lower semiconductor layer of an adjacent one of the plurality of non-polar light emitting cells through the opening of the etching prevention layer.

18. The light emitting device of claim 17, further comprising an interlayer insulating layer interposed between the substrate and the electrodes.

19. The light emitting device of claim 17, wherein each of the electrodes comprises a reflective layer and a protective metal layer to protect the reflective layer.

20. The light emitting device of claim 19, wherein the reflective layer is disposed on a lower surface of the second conductive-type lower semiconductor layer, and the protective metal layer covers side and lower surfaces of the reflective layer.

* * * * *